(12) United States Patent
Lifka et al.

(10) Patent No.: US 7,573,195 B2
(45) Date of Patent: Aug. 11, 2009

(54) DISPLAY PANEL COMPRISING CONDUCTIVE BARRIER STRUCTURES

(75) Inventors: Herbert Lifka, Eindhoven (NL); Cornelis Adrianus Henricus Antonius Mutsaers, Eindhoven (NL); Nijs Cornelis Van Der Vaart, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 328 days.

(21) Appl. No.: 10/579,312

(22) PCT Filed: Nov. 16, 2004

(86) PCT No.: PCT/IB2004/052449

§ 371 (c)(1),
(2), (4) Date: May 16, 2006

(87) PCT Pub. No.: WO2005/051049

PCT Pub. Date: Jun. 2, 2005

(65) Prior Publication Data

US 2007/0069619 A1    Mar. 29, 2007

(30) Foreign Application Priority Data

Nov. 21, 2003   (EP)   ................... 03104322

(51) Int. Cl.
*H01J 1/62*      (2006.01)
*H01J 63/04*     (2006.01)

(52) U.S. Cl. .............. 313/507; 313/498; 313/504; 313/506; 313/509

(58) Field of Classification Search .......... 313/489–512
See application file for complete search history.

(56) References Cited

U.S. PATENT DOCUMENTS

| 6,226,171 | B1* | 5/2001 | Beilin et al. | 361/306.3 |
| 6,873,091 | B2* | 3/2005 | Bechtel et al. | 313/112 |
| 6,952,490 | B2* | 10/2005 | Lee | 382/124 |
| 2004/0223886 | A1* | 11/2004 | Liu et al. | 422/100 |
| 2005/0057151 | A1* | 3/2005 | Kuwabara | 313/506 |
| 2005/0127376 | A1* | 6/2005 | Young et al. | 257/80 |
| 2005/0146279 | A1* | 7/2005 | Hector et al. | 315/169.3 |
| 2005/0255616 | A1* | 11/2005 | Childs et al. | 438/22 |

FOREIGN PATENT DOCUMENTS

WO    WO 03079449 A 1    * 9/2003

* cited by examiner

*Primary Examiner*—Sikha Roy
*Assistant Examiner*—Jose M Diaz

(57) ABSTRACT

A display panel is formed on a substrate and includes display pixels with at least one light emissive layer and at least one electrode layer or cathode deposited on or over said light emissive layer. The display panel further includes electrically conductive structures shunting the electrode layer. The barrier structures separating the display pixels may be used as the electrically conductive structures.

15 Claims, 4 Drawing Sheets

DISPLAY PANEL COMPRISING CONDUCTIVE BARRIER STRUCTURES

The invention relates to a display panel formed on a substrate and comprising a plurality of display pixels with at least one light emissive layer and at least one electrode layer deposited on or over said light emissive layer.

Display panels employing display pixels comprising electroluminescent material on or over a substrate are becoming increasingly popular. These light emitting elements may be light emitting diodes (LED's), incorporated in or forming the display pixels that are arranged in a matrix of rows and columns. The materials employed in such LED's are suitable to generate light if a current is conveyed through these materials, such as particular polymeric (PLED) or small molecule organic (SMOLED) materials. Accordingly the LED's have to be arranged such that a flow of current can be driven through these electroluminescent materials. Typically passively and actively driven matrix displays are distinguished. For active matrix displays, the display pixels themselves comprise active circuitry such as one or more transistors.

PLED materials provide advantages over SMOLED materials due to their intrinsic characteristics of thermal stability, flexibility and solubility in aqueous solutions or solvents. As a result, PLED materials can be applied by wet chemical techniques such as spincoating or ink jet deposition.

EP-A-0 892 028 discloses an organic EL element wherein transparent pixel electrodes are formed on a transparent substrate. Photolithographically defined photoresist banks are formed between the pixel electrodes to prevent a liquid ink drop comprising electroluminescent material to unintentionally flow to adjacent display pixels.

For some display panels, e.g. those having top emission or translucent display panels, the top electrode layer for applying the current to the electroluminescent materials should be transparent for the light emitted from the display pixels. Such transparent electrode layers intrinsically have a relatively high electrical resistance. For such display panels therefore a conflict exists in either increasing the thickness of the electrode layer to decrease the electrical resistivity at the cost of transparency or decreasing the thickness of the top electrode layer to enhance the transparency yielding an even higher electrical resistivity having detrimental effects to the power consumption of devices employing such display panels.

It is an object of the invention to provide a display panel with an optically transparent electrode layer of low resistance.

This object is achieved by providing a display panel that further comprises electrically conductive structures shunting said electrode layer. In shunting, the electrode layer is cross connected by one or more of said electrically conductive structures that are able to divert a part of the electrical current through the electrode layer over these electrically conductive structures. In such a display device, the electrical resistance of the electrode layer is decreased by an external measure not affecting the thickness of the electrode layer. Therefore the thickness of the electrode layer can be maintained reasonably thin without resulting in an unacceptable increase of the electrical resistance of the electrode layer.

In an embodiment of the invention the display pixels are separated by barrier structures forming said electrically conductive structures and said electrode layer contacts said barrier structures for shunting said electrode layer. As the barrier structures themselves are typically already present between the display pixels, usage of these barrier structures for shunting avoids additional manufacturing steps and the aperture of the display pixels is not reduced by such an electrically conductive structure. The barrier structures form 'tiny cups', corresponding to the pixels, that are filled with the light emitting polymers. In contrast to organic barrier structures, metallic barrier structures form a barrier for diffusion of water from one pixel to another.

In an embodiment of the invention the barrier structures of adjacent display pixels are in electrical contact. Although not essential, as the electrode layer itself already connects the barrier structures, the electrical contact between the barrier structures may further reduce the resistance of the electrical path resulting in an improved shunting performance.

In an embodiment of the invention an insulation layer separates the light emissive layer from said barrier structures. As the light emissive layer is electrically conductive, this insulation layer avoids the flow of leakage currents between an electrode underneath the light emissive layer and the electrode layer via the barrier structure. Further the chemical activity of particular substances, such as a PEDOT hole injection layer, may corrode or oxidize the barrier structures resulting in bad electrical contacts with the electrode layer in this area. Preferably the barrier structures comprise side walls covered by a hydrophobic insulating layer, such as a photoresist layer or a a-Si layer, as an insulating spacer layer. Alternatively the barrier structures may comprise side walls having a substantially inclined orientation with respect to said substrate, said side walls being covered by an anodized insulating spacer layer.

In an embodiment of the invention the display panel further comprises structures to locally separate said electrode layer. Such structures may be build-in shadow masks that can be employed to separate the electrode layer in a plurality of strips typically used in passive matrix display panels. These strips are still shunted by the barrier structures of the display pixels of a particular strip.

In an embodiment of the invention the barrier structures are available at or near at least one edge of the display panel, e.g. to contact outside electronics.

In an embodiment of the invention the barrier structures are at least partially covered by at least one light absorbing electrically conductive layer. Such a light absorbing layer is advantageous for top-emission display panels to reduce light scattering of the metallic barrier structures to improve e.g. daylight contrast. Preferably the light absorbing layer comprises an oxide material or an oxide-metal material combination. Such layer may either be intrinsically light absorbent or react with other layers of the display panel, such as the electrode layer to be deposited afterwards, to become or stay light absorbent after deposition.

In an embodiment of the invention the barrier structures are fully reflective or covered with a reflective layer and the display panel further comprises a light blocking layer, e.g. a circular polarizer. Any incoming light is entirely reflected by the barrier structure and completely blocked subsequently, such that light scattering is reduced or eliminated.

It should be appreciated that the display panel discussed above may constitute either a part of an electric device or an electric device as such. Such an electric device may e.g. relate to handheld devices such as a mobile phone, a Personal Digital Assistant (PDA) or a portable computer as well as to devices such as a monitor for a Personal Computer, a television set or a display on e.g. a dashboard of a car.

The invention further relates to a method for manufacturing a display panel on a substrate comprising the steps of:

defining a plurality of display pixel areas by deposition of electrically conductive barrier structures on or over said substrate;

filling said separated display pixel areas bounded by said barrier structures with at least one substance forming a light emissive layer;

depositing an electrode layer on or over said light emissive layer and in contact with said barrier structures.

This method results in a display panel wherein the thickness of the electrode layer can be maintained reasonably thin without resulting in an unacceptable increase of the electrical resistance of the electrode layer. As the barrier structures themselves are already present between the display pixels, usage of these barrier structures for shunting avoids additional manufacturing steps and the aperture of the display pixels is not reduced by an additional electrically conductive structure.

In an embodiment of the invention the method further includes the step of forming an insulating spacer layer between said polymer substance and said barrier structure. Such an insulating layer may reduce or eliminate leakage currents and avoids chemical degradation of the barrier structures.

In a preferred embodiment of the invention the method further includes the steps of:

providing a mask layer on or over said barrier structures;

underetching said mask layer to form substantially inclined side walls for said barrier structures;

depositing an oxide insulating spacer layer by executing an anodization treatment using a counter electrode and connecting said electrically conductive barrier structures as a second electrode in an anodization bath.

These steps were found to be advantageous as the electrically conductive barrier structures can be made available for external connection, such that the barrier structures may constitute an electrode in an anodization bath. Surprisingly, water was found as an ideal liquid to perform the anodization treatment using a stack of TiW and Al for the barrier structure and Al as the first electrode.

The invention will be further illustrated with reference to the attached drawings, which show preferred embodiments according to the invention. It will be understood that the invention is not in any way restricted to these specific and preferred embodiments.

Figure 1:
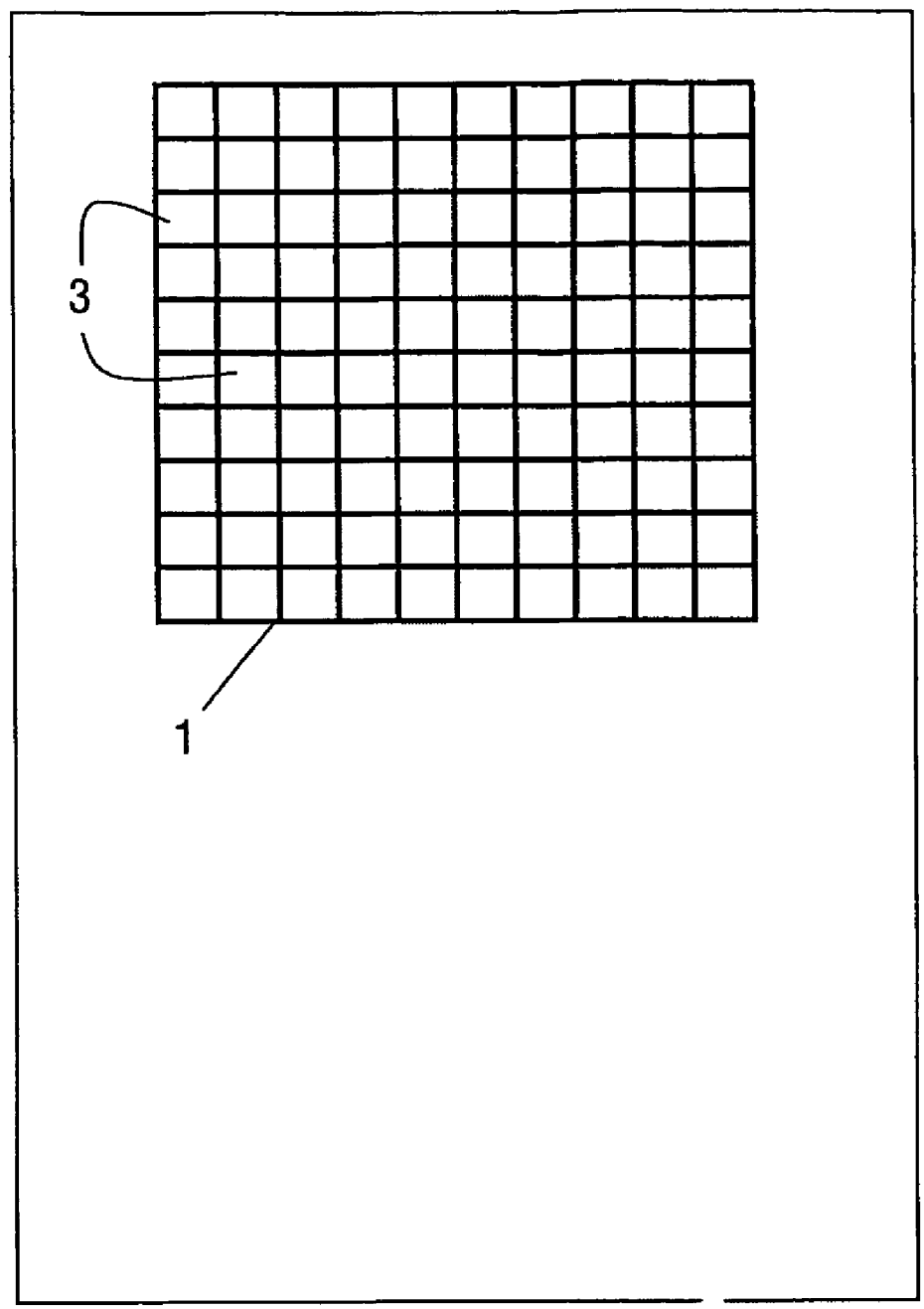
FIG. 1 shows a schematical electric device with a display panel according to an embodiment of the invention.

FIG. 1 schematically shows a display panel 1 of an electric device 2 having a plurality of display pixels 3 arranged in a matrix of rows and columns. The display panel 2 may either be an active matrix display panel or a passive matrix display panel 1 containing polymer light emitting diodes (PLEDs) or small molecule light emitting diodes (SMOLEDs)

Figure 2:
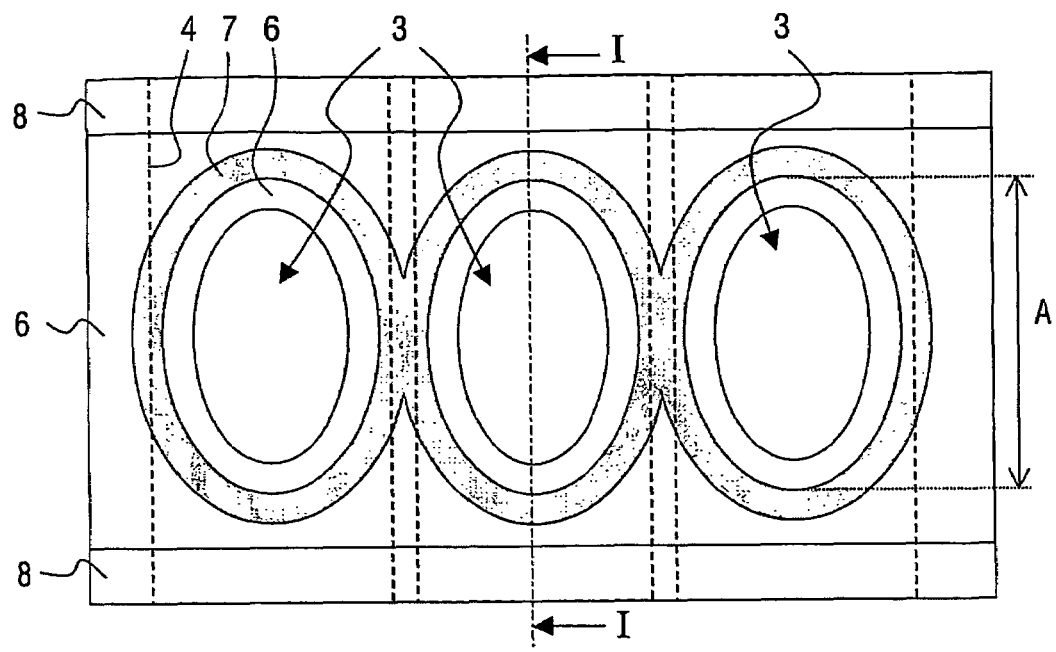
FIG. 2 shows a part of a display panel according to a first embodiment of the invention
Figure 3:
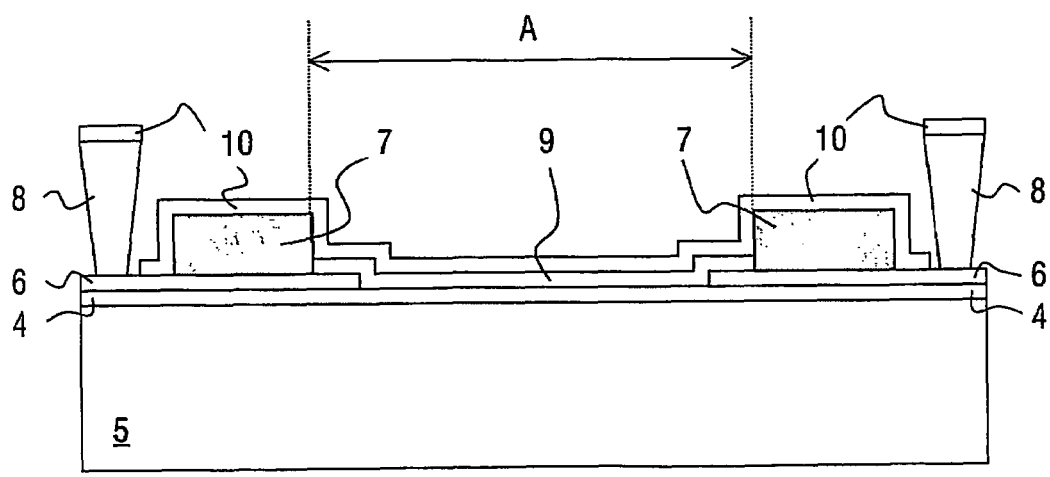
FIG. 3 shows a cross-section along I-I of FIG. 2.

FIG. 2 illustrates a part of the display panel 1 with three display pixels 3 according to a first embodiment of the invention. FIG. 3 shows a cross-section along line I-I of the part of the display panel 1 shown in FIG. 2.

A first electrode layer 4, commonly referred to as the anode, is deposited on or over the substrate 5, e.g. by vacuum evaporation or sputtering. The anode 4 can subsequently be patterned by photolithography, as shown in FIG. 2 by the areas bounded by the dashed lines. The anode 4 may either be transparent, absorbent or reflective, depending on the type of emission required for the display panel 1. Generally the anode 4 is transparent for a bottom-emission type of display panel 1, wherein light is emitted through the substrate 5 or for a translucent display panel 1, wherein the display panel 1 is fully transparent. For example, a transparent hole-injecting electrode material, such as Indium-Tin-Oxide (ITO), may be used. The anode 4 is usually reflective for a top-emission type of display panel 1, wherein light is emitted from the display panel 1 away from the substrate 5. In this case the anode 4 may be a metal or a metal covered with ITO.

After patterning of the anode 4, an insulating layer 6 of e.g. silicon-dioxide and one or more electrically conductive layers, e.g. aluminum and molybdenum layers are deposited. The electrically conductive layers are subsequently patterned to define electrically conductive structures 7. In this embodiment the electrically conductive structures 7 are used as barrier structures 7 that define or separate adjacent display pixels 3. Further the $SiO_2$-layer 6 is defined to expose the anode 4 at a part of the display pixel area A and holes may be defined for electrical cross-connections, if required.

The barrier structures 7 form 'tiny cups', corresponding to the pixels, that are filled with light emitting polymers at a later stage. In contrast to organic barrier structures, the metallic barrier structures 7 form a barrier for diffusion of water from one pixel to another. This water may e.g. be present in the conductive polymers deposited in the cups formed by the barrier structures 7. Preferably the barrier structures 7 are in electrical contact, as shown in FIG. 2. The thickness or height of the barrier structures typically vary in the range of 0.1-5 µm, more preferably in the range of 0.5-3 µm, such as 1.5 µm. The minimal width of the barrier structures 7 may be in the range of 1-10 µm, e.g. 5 µm. Near the edges of the display panel 1, the width of the barrier structures 7 may be much larger, e.g. several centimeters.

For passive matrix display panels 1, and occasionally as well for active matrix display panels 1, further structures 8 can be applied.

Subsequently polymers 9 are deposited, e.g. by inkjet printing. It is noted that a display pixel 3 may comprise several conductive polymer layers, such as a polyethylenedioxythiophene (PEDOT) layer and a polyphenylenevinylene (PPV), the latter being a light emitting polymer (LEP). For a color light emitting display different light emitting materials may be used. The metallic barrier structure 7 typically is hydrophobic, while the SiO2-layer 6 is hydrophilic. Therefore the light emitting materials spread appropriately over the display pixel area A.

Finally an electrode layer 10, commonly referred to as cathode, is deposited over the display panel. For clarity purposes this cathode 10 is not shown in FIG. 2. Typically for active matrix display panels 1 the cathode is a non-interrupted slab, i.e. a common cathode is used for all display pixels 3, while for passive matrix display panels 1 the cathode is separated for each row or column by the further structure 8. The cathode 10 may be either transparent or reflective. Especially for a transparent cathode 10 a high electrical resistivity is present. The cathode 10 is shunted via the electrically conductive barrier structures 7, such that a considerable reduction of the thickness of the cathode 10 can be achieved.

Preferably the thickness of the cathode 10 is in the range of 10-100 nm, and more preferably in the range of 10-80 nm, such as 30 nm. This considerably reduced thickness significantly enhances the transparency of the cathode. The barrier structures 7 may be metallic or comprise metallic parts enabling conduction of currents of the cathode 10. It is noted that the walls of the barrier structures 7 may be steep as the cathode 10 is at least in electrical contact with the top surface of the barrier structures 7. However, preferably the walls of the barrier structures 7 have an inclined orientation to the substrate 5, as shown e.g. in FIG. 5, to obtain a shallow barrier structure allowing a good step coverage by the cathode layer 10.

In the case of a passive matrix display panel 1, the cathode 10 is structured by the further structures 8 in lines whereas the shunting by the barrier structure 7 is present for each particular line.

The deposition of the polymer substances in the display pixel area A frequently results in contact between the PEDOT and the metallic barrier structure 7. As PEDOT is electrically conductive, a leakage current is likely to flow between the anode 4 and the cathode 10 via the electrically conductive structure 7. Further, as the PEDOT-solution is acidic, the aluminum of the barrier structure 7 may be affected detrimentally causing local corrosion. This may eventually result in bad contact of the barrier structure 7 and the cathode 10.

Figure 4:
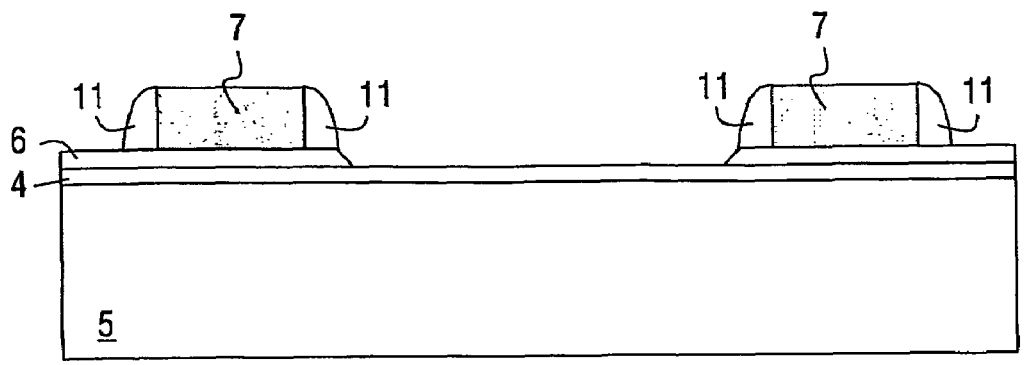
FIG. 4 shows a cross-section of a part of a display panel according to a second embodiment of the invention.
Figure 5:
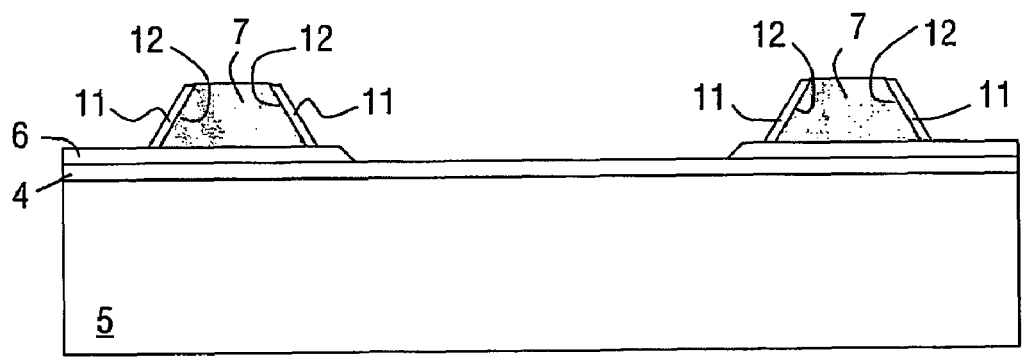
FIG. 5 shows a cross-section of a part of a display panel according to a third embodiment of the invention.

The embodiments shown in FIGS. 4 and 5 take these effects into account by providing an insulating layer 11 that separates the polymers 9 from the barrier structures 7.

In FIG. 4 the barrier structures 7 comprise side walls being covered by a hydrophobic insulating layer, such as amorphous silicon or photoresists, as an insulating spacer layer 11. The spacer layer 11 is preferably hydrophobic or made hydrophobic before polymer processing such that the spacer layer 11 is not be wetted by the polymers 9.

In this embodiment a photoresist is deposited over the display panel, e.g. by spincoating. In case the further structures 8 should be applied, this step is preferably taken before definition of these further structures 8. The photoresist layer preferably is deposited to a thickness not much larger than the height of the barrier structures 7 to avoid planarization of the photoresist over the display panel 1. After deposition of the resist an anisotropic RIE-etch is performed with an $O_2$-plasma, such that at the side walls of the barrier structures 7 the insulating spacer layers 11 are formed. The spacer layer 11 is smooth such that the cathode 10 (not shown in FIG. 4) can be deposited over the structure without interruptions. The spacer layer 11 protects the metallic barrier structure 7 from the polymers 9, especially the PEDOT, such that the above-mentioned detrimental effects will not or less likely occur.

In FIG. 5 the barrier structures 7 comprise side walls 12 having a substantially inclined orientation with respect to the substrate 5. The side walls 12 are covered by an anodized insulating spacer layer 11. The insulating spacer layer 11 again protects the metallic barrier structure 7 from being detrimentally affected by the PEDOT-material.

Figure 6:
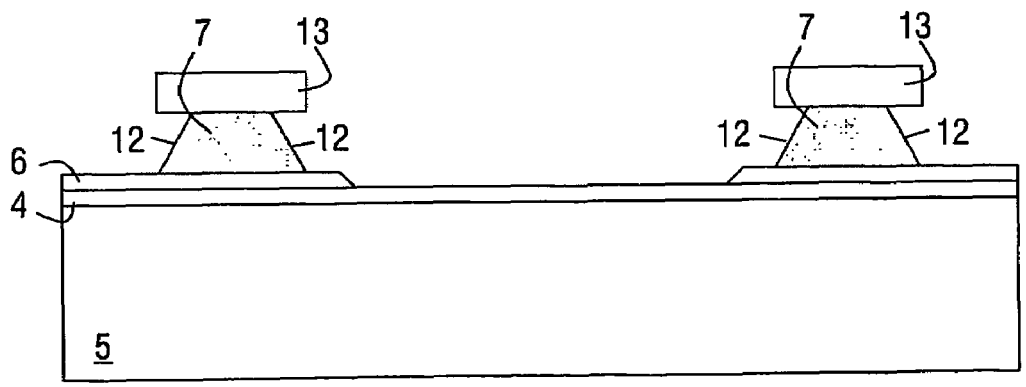
FIG. 6 shows a cross-section of a part of a display panel during manufacturing of the display panel of FIG. 5.
Figure 7:
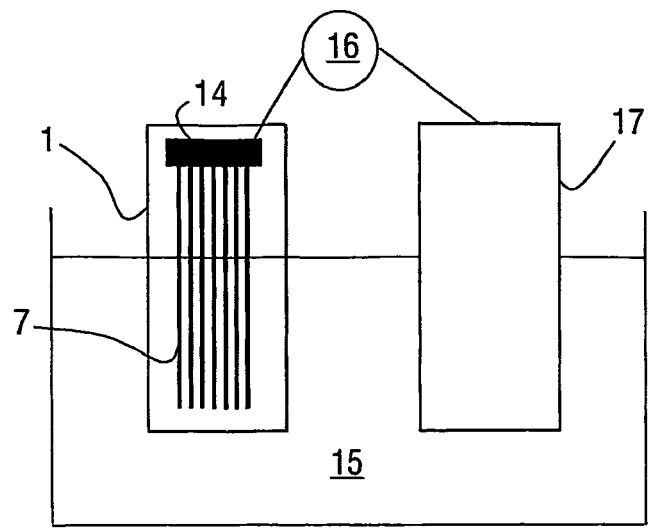
FIG. 7 illustrates an anodization treatment performed o the display panel shown in FIG. 6.

FIGS. 6 and 7 illustrate a preferred manufacturing process for the embodiment displayed in FIG. 5. After definition of the metallic barrier structures 7 the inclined side walls 12 are formed by underetching the photoresist mask 13 used for defining the barrier structures 7 either by wet etching or plasma etching. The photoresist mask 13 is maintained to be used in a subsequent anodization treatment for applying the insulating spacer layer 11 on the inclined side walls 12. The metallic barrier structures 7 are available on the display panel 1 for electrical connection with a contact element 14. If the barrier structure comprises TiW and Al, it was observed that water 15 can be used as an oxidizer for application of the insulating spacer layer 11 on the inclined side walls 12. A voltage source 16 applying 30 V between the contact element 14 and an Al-counter electrode 17 was found to result in an AlO-spacer layer 11. After the anodization treatment, the photoresist mask 13 is removed. If required, the further structures 8 can be defined on the display panel 1 afterwards. The contact element 14 can be removed from the display panel 1 as this element 14 provides a short circuit between the respective barrier structures 7. However, for an active matrix display panel 1 with a common cathode 10, the element 14 may be maintained to contact the cathode 10.

It is noted that the described embodiments may all include further layers or structures and are generally protected by a lid.

In conclusion the invention allows the cathode 10 to combine appropriate transparency with a reasonably low electrical resistivity by electrically shunting of the cathode 10, preferably by using the barrier structures 7 between the display pixels 3. The barrier structures 7 fulfill the dual function of defining the pixels by forming dams for the liquid light emitting polymers and of shunting the cathode 10.

Figure 8:
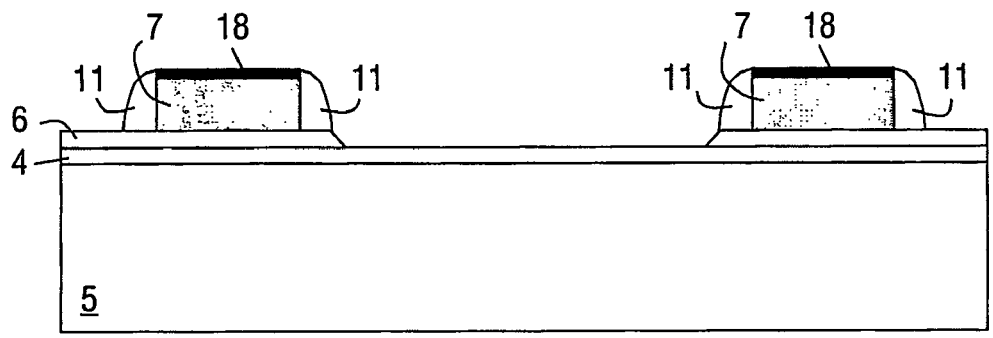
FIG. 8 shows a cross-section of a part of a display panel according to a fourth embodiment of the invention.

FIG. 8 schematically shows an embodiment of the invention for a top-emission display panel 1, wherein the barrier structures 7 are covered by at least one light absorbing electrically conductive layer 18, hereinafter also referred to as black layer 18. The black layer 18 may be deposited on top of the electrically conductive layer before structuring this layer to obtain the barrier structures 7. The black layer 18 may comprise an oxidic material having some conductance, such as $RuO_2$, $IrO_2$, $Pb_2Ru_2O_7$, $Bi_2Ru_2O_7$ or $Pb_3Rh_7O_{15}$. Such layers 18 do not react with the material of the cathode 10 and are intrinsically absorbent and conductive. Another class of materials can be those, which will react with the cathode 10, but have some resistance to the further processing such a the printing of the light emitting polymers, the deposition of the cathode 10 and the encapsulation. After reaction with the cathode 10 these materials should become absorbent or stay absorbent and conductive. Materials may include mixtures of SiO with Al, SiO with Ag or other oxide-metal combinations. The black layer 18 preferably has a limited thickness, such as in the range of 20-500 nm, such as 100 nm.

Figure 9:
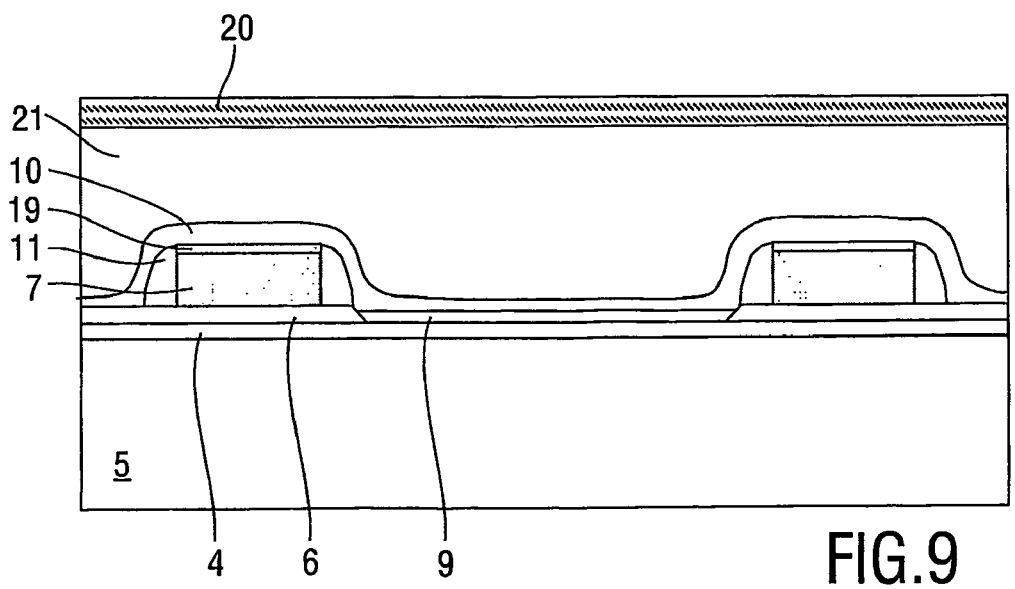
FIG. 9 shows a cross-section of a part of a display panel according to a fifth embodiment of the invention.

FIG. 9 schematically shows an embodiment of the invention wherein the barrier structures 7 are fully reflective or covered with a reflective layer 19 and the display panel 1 further comprises a contrast enhancement layer 20, e.g. a circular polarizer. The reflective layer 19 may be added to increase the reflectivity. Preferably the reflective layer 19 is thin, such as in the range of 20-100 nm, to obtain a highly reflective layer. The contrast enhancement layer 20 is provided on top of the display panel 1, that is over the protective structure 21. Any incoming light is entirely reflected by the barrier structure 7 or the reflective layer 19 and completely blocked subsequently by the light blocking layer 20, such that light scattering from incident daylight is reduced or eliminated.

The invention claimed is:

1. A display panel formed on a substrate and comprising a plurality of display pixels with at least one light emissive layer and at least one electrode layer deposited on or over said light emissive layer, wherein said display panel further comprises electrically conductive structures shunting said electrode layer, wherein two adjacent ones of said electrically conductive structures are continuously covered by said electrode layer; wherein said display pixels are separated by barrier structures forming said electrically conductive structures and said electrode layer contacts said barrier structures for shunting said electrode layer; and wherein said barrier structures of adjacent display pixels are in direct electrical contact with each other.

2. The display panel according to claim 1, wherein at least one insulation layer separates said light emissive layer from said barrier structures.

3. The display panel according to claim 1, wherein said barrier structures comprise side walls being covered by a hydrophobic insulation layer, such as an amorphous silicon layer or a photoresist layer as an insulating spacer layer.

4. The display panel according to claim 1, wherein said barrier structures comprise side walls having a substantially inclined orientation with respect to said substrate, said side walls being covered by an anodized insulating spacer layer.

5. The display panel according to claim 1, wherein said display panel further comprises structures to locally separate said electrode layer.

6. The display panel according to claim 1, wherein said barrier structures are available at or near at least one edge of the display panel.

7. The display panel according to claim 1, wherein said barrier structures are at least partially covered by at least one light absorbing electrically conductive layer.

8. The display panel according to claim 7, wherein said light absorbing electrically conductive layer comprises an oxide material or an oxide-metal material combination.

9. The display panel according to claim 1, wherein said barrier structures are fully reflective or covered with a reflective layer and said display panel further comprises a polarization layer.

10. A method for manufacturing a display panel on a substrate comprising the acts of:
    defining a plurality of display pixel areas by deposition of electrically conductive barrier structures on or over said substrate;
    filling said separated display pixel areas bounded by said barrier structures with at least one substance to form a light emissive layer; and
    depositing an electrode layer on or over said light emissive layer and in contact with said barrier structures; wherein two adjacent ones of said electrically conductive structures are continuously covered by said electrode layer, and wherein said barrier structures of adjacent display pixels are in direct electrical contact with each other.

11. The method according to claim 10, further including the act of forming an insulating spacer layer between said light emissive layer and said barrier structure.

12. The method according to claim 10, further including the acts of:
    providing a mask layer on or over said barrier structures;
    underetching said mask layer to form substantially inclined side walls for said barrier structures;
    depositing an oxide insulating spacer layer by executing an anodization treatment using a counter electrode and connecting said electrically conductive barrier structures as a second electrode in an anodization bath.

13. The method according to claim 12, wherein said anodization bath contains water for oxidizing said side walls.

14. The display panel of claim 1, wherein near edges of the display panel, a first width of said conductive structures is larger than a second width of said barrier structures at inner portions of the display panel.

15. The method claim 10, wherein near edges of the display panel, a first width of said barrier structures is larger than a second width of said barrier structures at inner portions of the display panel.

\* \* \* \* \*